US012735808B2

(12) United States Patent
Young et al.

(10) Patent No.: US 12,735,808 B2
(45) Date of Patent: *Sep. 15, 2026

(54) LOW ETCH PIT DENSITY, LOW SLIP LINE DENSITY, AND LOW STRAIN INDIUM PHOSPHIDE

(71) Applicant: AXT, Inc., Fremont, CA (US)

(72) Inventors: Morris Young, Fremont, CA (US); Weiguo Liu, Fremont, CA (US); Wen Wan Zhou, Fremont, CA (US); Sungnee George Chu, Fremont, CA (US); Wei Zhang, Fremont, CA (US)

(73) Assignee: AXT, Inc., Fremont, CA (US)

( * ) Notice: Subject to any disclaimer, the term of this patent is extended or adjusted under 35 U.S.C. 154(b) by 85 days.

This patent is subject to a terminal disclaimer.

(21) Appl. No.: 18/788,306

(22) Filed: Jul. 30, 2024

(65) Prior Publication Data

US 2024/0384436 A1 Nov. 21, 2024

Related U.S. Application Data

(63) Continuation of application No. 18/117,669, filed on Mar. 6, 2023, now Pat. No. 12,054,851, which is a (Continued)

(51) Int. Cl.

*C30B 29/64* (2006.01)
*C30B 11/00* (2006.01)

(Continued)

(52) U.S. Cl.

CPC ............ *C30B 29/64* (2013.01); *C30B 11/002* (2013.01); *C30B 11/003* (2013.01);

(Continued)

(58) Field of Classification Search

CPC . H01L 29/20; C30B 29/40; C30B 11/002–14; H10D 62/85

See application file for complete search history.

(56) References Cited

U.S. PATENT DOCUMENTS

| | | | |
|---|---|---|---|
| 6,334,897 | B1 | 1/2002 | Asahi et al. |
| 11,608,569 | B2 | 3/2023 | Young et al. |

(Continued)

FOREIGN PATENT DOCUMENTS

| | | | |
|---|---|---|---|
| CN | 101688323 | A | 3/2010 |
| DE | 102005030851 | A1 | 1/2007 |
| JP | 2011148694 | A | 8/2011 |

OTHER PUBLICATIONS

Taiwanese We have received an Examination Report with Search Report for the Appln No. 110107297 dated Sep. 18, 2024.

(Continued)

*Primary Examiner* — Matthew E. Hoban

(74) *Attorney, Agent, or Firm* — McAndrews, Held & Mallloy, Ltd.

(57) ABSTRACT

Methods and wafers for low etch pit density, low slip line density, and low strain indium phosphide are disclosed and may include an indium phosphide single crystal wafer having a diameter of 4 inches or greater, having a measured etch pit density of less than 500 $cm^{-2}$, and having fewer than 5 dislocations or slip lines as measured by x-ray diffraction imaging. The wafer may have a measured etch pit density of 200 $cm^{-2}$ or less, or 100 $cm^{-2}$ or less, or 10 $cm^{-2}$ or less. The wafer may have a diameter of 6 inches or greater. An area of the wafer with a measured etch pit density of zero may at least 80% of the total area of the surface. An area of the wafer with a measured etch pit density of zero may be at least 90% of the total area of the surface.

19 Claims, 16 Drawing Sheets

100

Related U.S. Application Data continuation of application No. 17/186,671, filed on Feb. 26, 2021, now Pat. No. 11,608,569.

(60) Provisional application No. 62/983,244, filed on Feb. 28, 2020.

(51) Int. Cl.

| | |
|---|---|
| ***C30B 11/14*** | (2006.01) |
| ***C30B 29/40*** | (2006.01) |
| ***C30B 33/10*** | (2006.01) |
| ***H10D 62/85*** | (2025.01) |

(52) U.S. Cl.

CPC ............ *C30B 11/006* (2013.01); *C30B 11/14* (2013.01); *C30B 29/40* (2013.01); *C30B 33/10* (2013.01); *H10D 62/85* (2025.01)

(56) References Cited

U.S. PATENT DOCUMENTS

| | | | | |
|---|---|---|---|---|
| 12,054,851 | B2 * | 8/2024 | Young | H10D 62/85 |
| 12,398,486 | B2 * | 8/2025 | Liu | C30B 29/42 |
| 2007/0101924 | A1 | 5/2007 | Kawase | |
| 2008/0019896 | A1 | 1/2008 | Noda et al. | |
| 2008/0280427 | A1 | 11/2008 | Liu et al. | |
| 2009/0072205 | A1 | 3/2009 | Kawase | |
| 2011/0293890 | A1 | 12/2011 | Liu et al. | |
| 2020/0066850 | A1 | 2/2020 | Nishioka et al. | |
| 2020/0190697 | A1 | 6/2020 | Shetty et al. | |

OTHER PUBLICATIONS

Int'l Search Report and Written Opinion Appln No. PCT/US2021/020111 mailed Aug. 31, 2021.

Monberg et al., 'The Growth and Characterization of Large Size, High Quality, InP Single Crystals', Journal of the Electrochemical Society, vol. 135, No. 2, Feb. 1988 A (Feb. 1988). pp. 500-503.

Wolf et al., 'Preparation and characterization of semi-insulating 2 in InP wafers having a low Fe content by wafer annealing' Material Science and Engineering: B, vol. 28, issues 1-3. Dec. 1994 (Dec. 1994). pp. 115-119.

Hirt et al., 'Mesoscopic Nonuniformity of Wafer-Annealed Semi-Insulating InP', Journal of Electronic Materials, vol. 25, No. 3, Mar. 1996 (Mar. 1996), pp. 363-367, particularly p. 364.

Chinese office action Appln No. 2021800173460 dated Jul. 26, 2023.

European Office Communication with extended search report Appln No. 21761031.0 dated Jan. 19, 2024.

Tawian Patent Office, Exam and Search Report, Appln No. 114137865, dated May 4, 2026, 16 pages.

* cited by examiner

InP (400) Transmission Mode

LOW ETCH PIT DENSITY, LOW SLIP LINE DENSITY, AND LOW STRAIN INDIUM PHOSPHIDE

CROSS-REFERENCE TO RELATED APPLICATIONS/INCORPORATION BY REFERENCE

This application is a continuation of U.S. Provisional application Ser. No. 17/186,671 filed on Feb. 26, 2021, and claims priority to and the benefit of U.S. Provisional Application 62/983,244 filed on Feb. 28, 2020, both of which are hereby incorporated by reference in their entirety.

FIELD

Certain embodiments of the disclosure relate to semiconductor substrates. More specifically, certain embodiments of the disclosure relate to low etch pit density, low slip line density, and low strain indium phosphide.

BACKGROUND

Semiconductor substrates, and specifically Group III-V semiconductor substrates, are used in the manufacture of electronic and optoelectronic devices such as heterojunction bipolar transistors (HBTs), pseudo-morphic high-electron mobility transistors (pHEMTs), lasers, and detectors for example. Defects in the substrates can reduce yields and increase costs.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for low etch pit density, low slip line density, and low strain indium phosphide, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Certain aspects of the disclosure may be found in a method and wafers for low etch pit density, low slip line density, and low strain indium phosphide.

Figure 1:
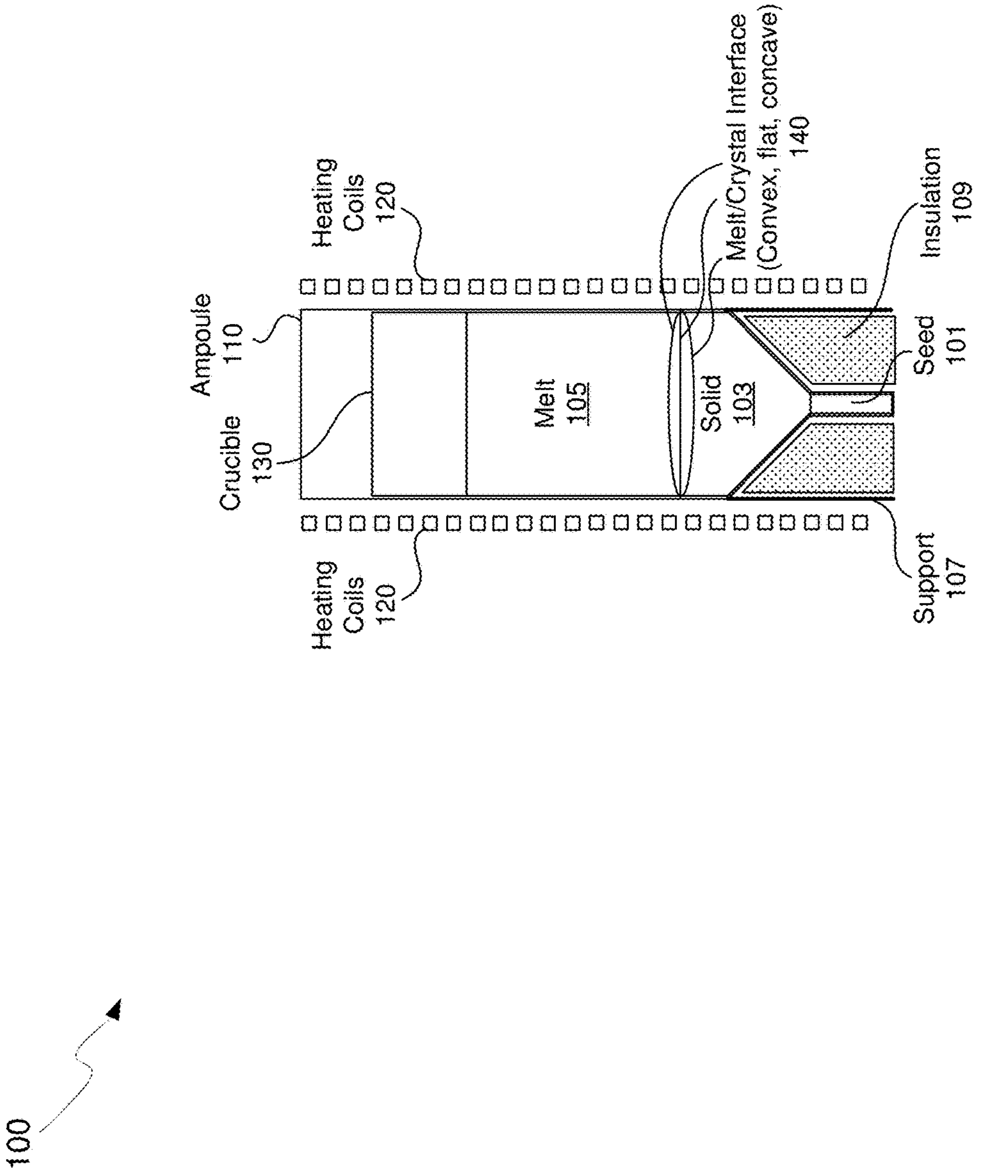
FIG. 1 is a diagram illustrating a vertical gradient freeze reactor, in accordance with an example embodiment of the disclosure.

FIG. 1 is a diagram illustrating a vertical gradient freeze reactor, in accordance with an example embodiment of the disclosure. Referring to FIG. 1, there is shown vertical gradient freeze (VGF) system 100 comprising an ampoule 110, a support 107, heating coils 120, and a crucible 130. Within the ampoule 110, growth may proceed using a seed crystal 101 and a liquid melt 105 in a vertical configuration, where a solid 103 forms due to very gradual cooling of the liquid melt 105. The crucible 130 may comprise pyrolytic boron nitride (PBN), for example, and may contain the melt and seed materials during the process.

The VGF system 100 comprises a configuration for growth charge, heater, insulation and support structure. The heating coils 120 may be configured to provide direct radiation above the level of the cone in the crystal growth charge and the seed crystal 101. The VGF system 100 may also comprise a support structure 107 for support of the ampoule 110 within the heating coils 120. In addition, insulation 109 may be placed within the support structure 107 to promote radial heat flux inward during growth and heat removal during post-growth process and cooling. The support structure 107 may comprise a cylinder for the growth ampoule 110, which may comprise a hollow core below the seed pocket holding the seed crystal 101 to provide a conducting heat flow path downward through the center. The heat flow downward is further aided and made more stable by a larger diameter quartz rod down to the bottom of the heater.

In the VGF process, a polycrystal charge, the seed crystal 101, in crucible 130 in the ampoule 110 may be heated with a multi-zone furnace, as represented by the heating coils 120. Crystal growth is initiated by melting the charge to the seed crystal 101, thereby forming the liquid melt 105, and slowly reducing the temperature to cool the liquid melt 105 at the seed crystal 101. The crystallization process, forming the solid 103, may be precisely controlled by varying the temperature grading in different zones of the furnace, such as by applying different currents to different portions of the heating coils 120. Accordingly, the heating coils 120 may comprise a multi-zone heating system where different temperatures, heating/cooling rates, and spatial temperature profiles are enabled.

The VGF process has several advantages over other processes such as liquid encapsulated Czochralski (LEC) and horizontal Bridgman (HB). First, the thermal environment of the crystal and melt are radially symmetric, enabling a planar growth interface and precise control of temperature profiles. Second, growth in low axial and radial temperature gradients, combined with diameter control imposed by a crucible, and no need to use a large temperature gradient to freeze the crystal quickly, significantly reduces the strain and, hence, dislocations in the crystals. Third, the liquid-solid interface progresses upward through the melt, with crystallization starting at the seed crystal 101 in the bottom of the crucible. The system is cooler at the bottom, and is thermally stabilized against convection. Even in the cooling process, easily adjustable cooling brings the crystal to room temperature at a rate that minimizes stress, and thus dislocations and slip lines.

Before crystal growth, the indium phosphide (InP) polycrystal may be prefabricated by poly synthesis. The poly synthesis process may be performed in a quartz reactor tube utilizing a boat method. Once the polycrystalline InP is generated, VGF crystal growth may proceed. To achieve low EPD, several VGF parameters are carefully controlled. The first parameter may include the shape of the melt/crystal interface 140, which may be controlled to be concave, flat, or convex to the melt. For example, the interface 140 may be 10 mm concave or convex with the center being ~5-20 mm lower or higher than the edge of the crystal. This may be controlled with different temporal and/or spatial temperature profiles.

Second, the crystallization velocity as controlled by the cooling rate may be configured to less than a degree C./hour, for example. Different solidification rates at different parts of the ingot may be configured. The temperature gradient along the growing crystal can create stress in the boule, where the head cools earlier and in some instances could have the head ~100 degrees cooler than the tail, so precise control is desirable.

Finally, the temperature gradient at the melt/crystal interface may be configured to control the melt/crystal interface, where many processes utilized configure the interface to be flat, while in this disclosure, a curved interface may be utilized. Again, multi-zone heating may enable precise control of the temperature throughout the crucible 130. After the overall solidification is completed, the temperature of the heating may be lowered to room temperature at the speed of about 1-2 degrees C./hour, 2-4 degrees C./hour, and 10-15 degrees C./hour, in different heating zones, respectively. This process results in a low-dislocation, low slip line density, low strain InP single crystal of about 50 cm or longer in length, with a cylindrical body portion. The dislocation densities resulting from this process are less than 2 $cm^{-2}$, less than 20 $cm^{-2}$, less than 200 $cm^{-2}$, and less than 500 $cm^{-2}$. This boule diameter is configured by the crucible 130 size, and may be 4 inches where wafers sizes of 4 inches or less may be fabricated, may be 6 inches resulting in 6 inch or less wafers, or 8 inches resulting in 8 inch or less wafers. Larger sizes are possible, depending on crucible 130 and heating coil 120 diameter.

Figure 2:
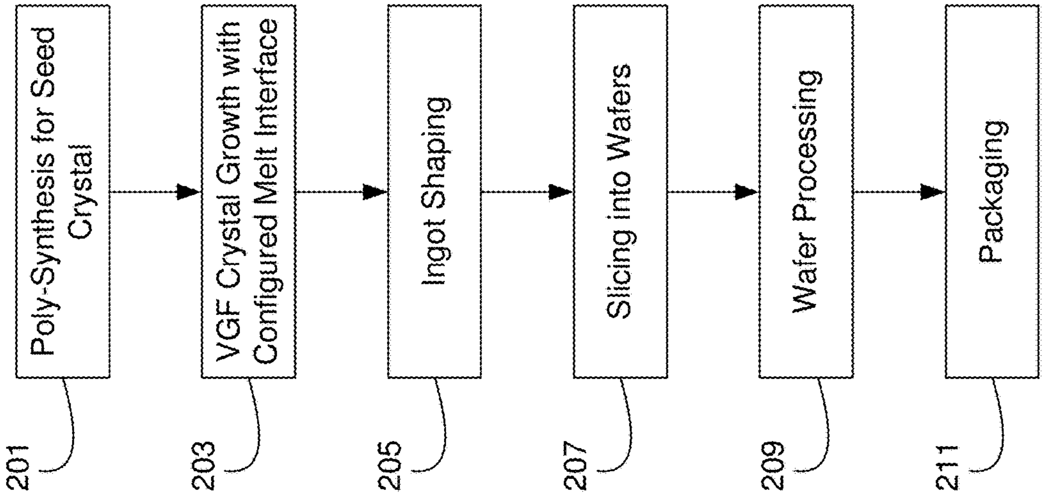
FIG. 2 illustrates a method for fabricating indium phosphide wafers using the vertical gradient freeze furnace 100 shown in FIG. 1.

FIG. 2 illustrates a method for fabricating InP wafers using the vertical gradient freeze furnace 100 shown in FIG. 1. The process results in InP substrates of 4, 6, or 8 inch diameter, or larger, with less than 2, 20, 200, and 500 $cm^{-2}$ etch pit density and a lack of slip line defects, as measured by various techniques described below. This process may also be used to fabricate gallium arsenide (GaAs), gallium phosphide (GaP) or other related III-V compound semiconductors.

In step 201, raw InP may be obtained and testing may be performed on the raw materials before being placed in a boat in a quartz tube for poly synthesis to produce polycrystalline InP. Once the polycrystalline InP is generated, vertical gradient freeze (VGF) crystal growth occurs in step 203 where the temporal and spatial temperature profiles are closely controlled to configure a curved melt/crystal interface resulting in crystals with less than 20, 200, 500 $cm^{-2}$ on 4 or 6 inch, or greater, diameter crystals. To achieve low EPD, several VGF parameters are carefully controlled. The first parameter may include the shape of the melt/crystal interface, which may be controlled to be concave, flat, or convex. This may be controlled with different temporal and/or spatial temperature profiles. Second, the crystallization velocity as controlled by the cooling rate may be configured to range from less than 1 degree C./hour. Different solidification rates at different parts of the ingot may be configured.

Once the VGF crystals are grown (and optionally tested), in step 205, an ingot shaping process may be conducted to result in a rounded ingot with desired flats, for example, and may also be tested. Once the ingot is shaped, the ingot may be sliced into wafers in step 207, and the wafers may be optionally tested.

Once the low EPD wafers have been sliced from the ingot, the wafers may proceed to wafer processing step 209. An optional wafer annealing process may be performed. In an example wafer annealing process, one or more annealing stages may be used, where the wafers may be loaded vertically into a horizontal quartz boat and inserted in a horizontal quartz ampoule along with phosphorus lumps. The phosphorus lumps may be configured to provide the needed vapor pressure at the annealing temperature to avoid any phosphorus dissociation from the InP substrates. Due to the high vapor pressure of phosphorus, the pressure may be higher during annealing. The ampoule and its contents may then be inserted into a horizontal 3-zone furnace, for example, and the heating of the ampoule and its contents to the desired set (platform) temperature may be initiated.

Once the low EPD wafers are annealed and optionally tested, a wafer polishing process may be performed that polishes the low EPD wafers and the polished wafers may again be optionally tested. Once the wafers are polished, they may be cleaned, and the process then proceeds to step 211 where polished and cleaned wafers may be packaged for shipping to customers. The above processes may also be used to produce gallium arsenide (GaAs) or other compound semiconductor wafers. As a result of this process, low EPD low slip line density and low strain 4 inch, 6 inch, and larger InP wafers are produced.

To assess wafer quality, various defect measurements may be utilized, such as average EPD, maximum EPD, and percentage of area with zero EPD, for example. For slip lines, a certain number of EPD measurement squares in a line, or near-linear shape, above a threshold length may indicate the presence of a slip line. Similarly, a certain number of measured areas adjacent to each other above a threshold number may be used to reject wafers. Strain levels in the wafer may be utilized to determine if a wafer may fail in subsequent processing steps.

Photoluminescence mapping may be used to assess substrate quality, where an area or linear region of low or high intensity may indicate defects. The defects may luminesce at a different wavelength, have a different spectral shape, full-width-at-half-maximum (FWHM), and/or intensity patterns. Also linear defects may be measured, where slip lines may enhance the PL signal.

Resistivity measurements may be utilized to determine wafer quality, with respect to slip lines, dislocations, or other strain related defects, as doping variation may correlate to the strain fields in the crystal. Similarly, photoelastic measurements enable a direct measurement of strain in the crystal, which may correlate to dislocations, slip lines, and other defects. X-ray diffraction imaging is another characterization technique that can detect structural defects at the surface as well as within the crystal.

FIGS. 3A-3D illustrate x-ray diffraction imaging results for indium phosphide substrates from different growth techniques, in accordance with an example embodiment of the disclosure. X-ray diffraction imaging (XRDI) uses x-rays to image bulk and surface crystalline defects in single crystal substrates. The x-ray beam may be transmitted through the substrate, in transmission mode, or reflected off the substrate, for reflection mode. In this manner, non-visual crystalline defects may be detected, where even a single dislocation extending tens of microns may be detected. These crystalline defects can lead to breakage during processing.

Figure 3A:
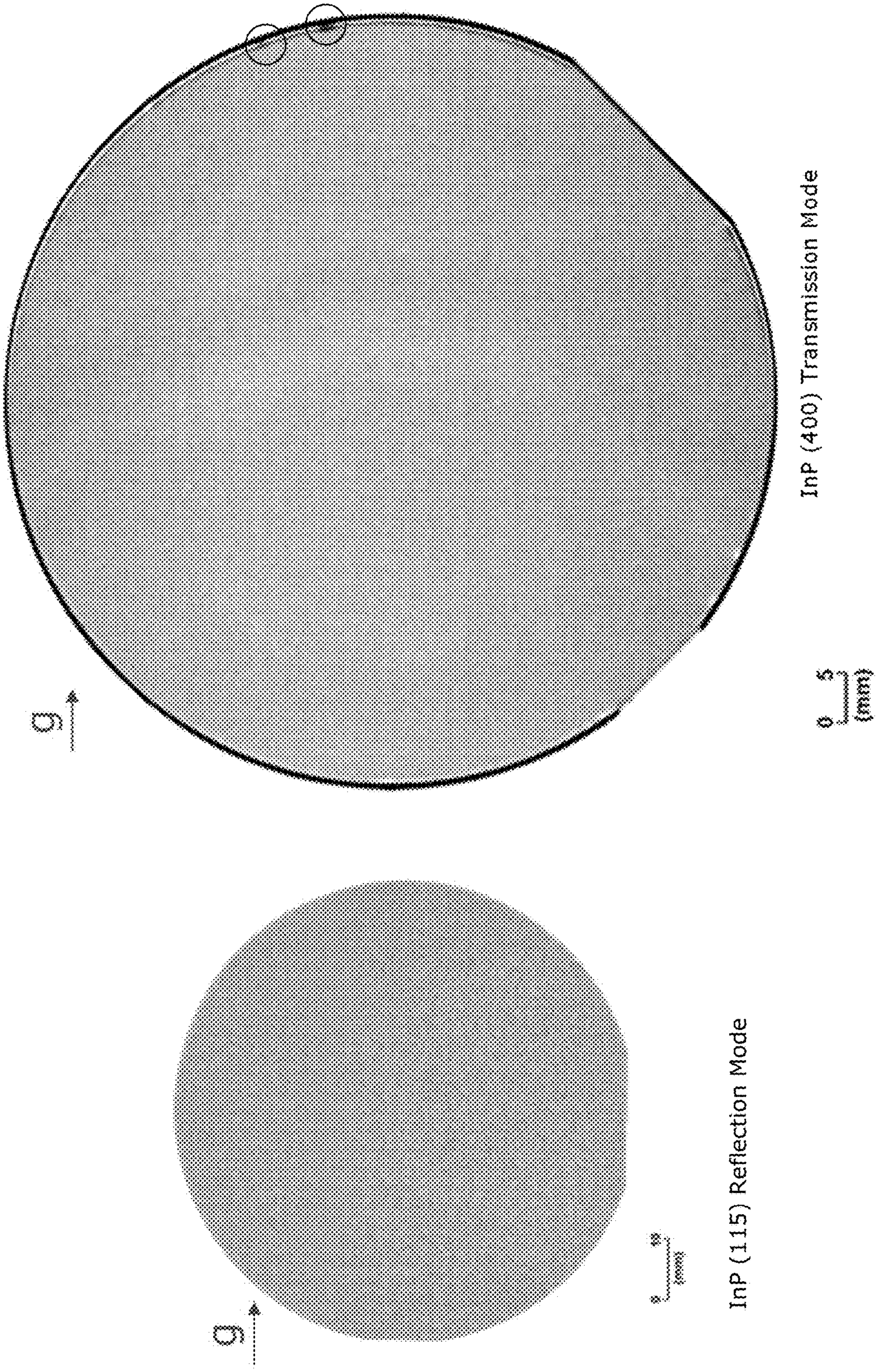
FIGS. 3A-3D illustrate x-ray diffraction imaging results for indium phosphide substrates from different growth techniques, in accordance with an example embodiment of the disclosure.

Referring to FIG. 3A, there is shown a reflection mode image and a transmission mode image of a 4 inch InP substrate grown by a VGF process, showing no slip lines, dislocations, or other structural defects in the reflection or transmission mode measurements, other than two edge defects in the transmission mode image. Fewer than 5 slip line and dislocation defects are consistently achieved in 4 inch and 6 inch substrates InP disclosed here.

Figure 3B:
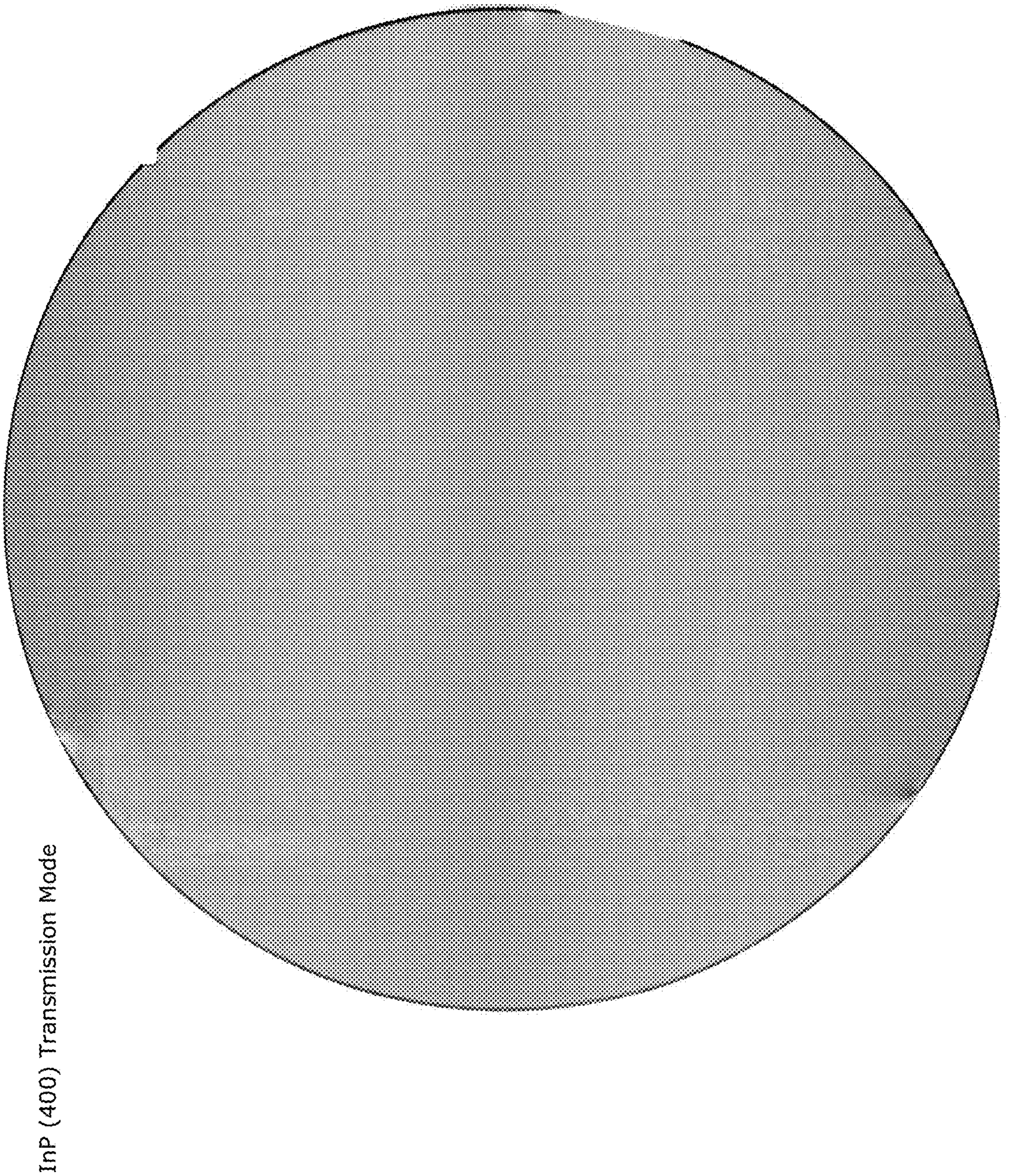

FIG. 3B illustrates x-ray diffraction results for a six inch indium phosphide substrate, in accordance with an example embodiment of the disclosure. Referring to FIG. 3B, there is shown a transmission mode XRDI result for a 6 inch sulfur-doped InP substrate grown by a VGF process, showing no slip lines, dislocations, or other structural defects in the transmission mode measurement, other than a few edge defects. Fewer than 5 slip line and dislocation defects are consistently achieved in 4 inch and 6 inch substrates.

Figure 3C:
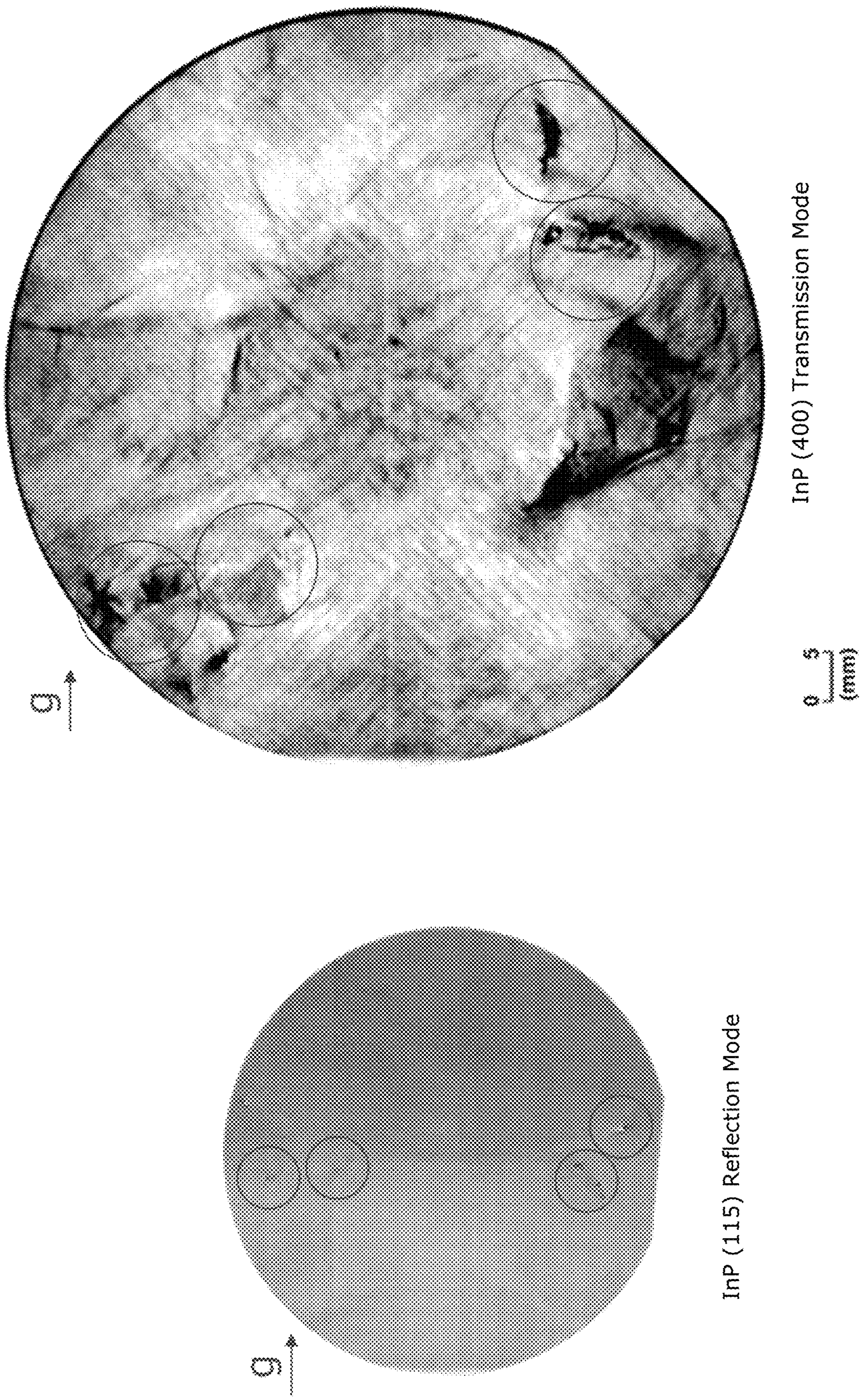

FIG. 3C shows XRDI reflection mode and transmission mode images of an InP substrate grown by another technique. While the reflection mode image shows a handful of defects, the transmission mode image shows a large number of defects and significant strain features/patterns. It should also be noted that the defects in reflection mode also show in the transmission mode image.

Figure 3D:
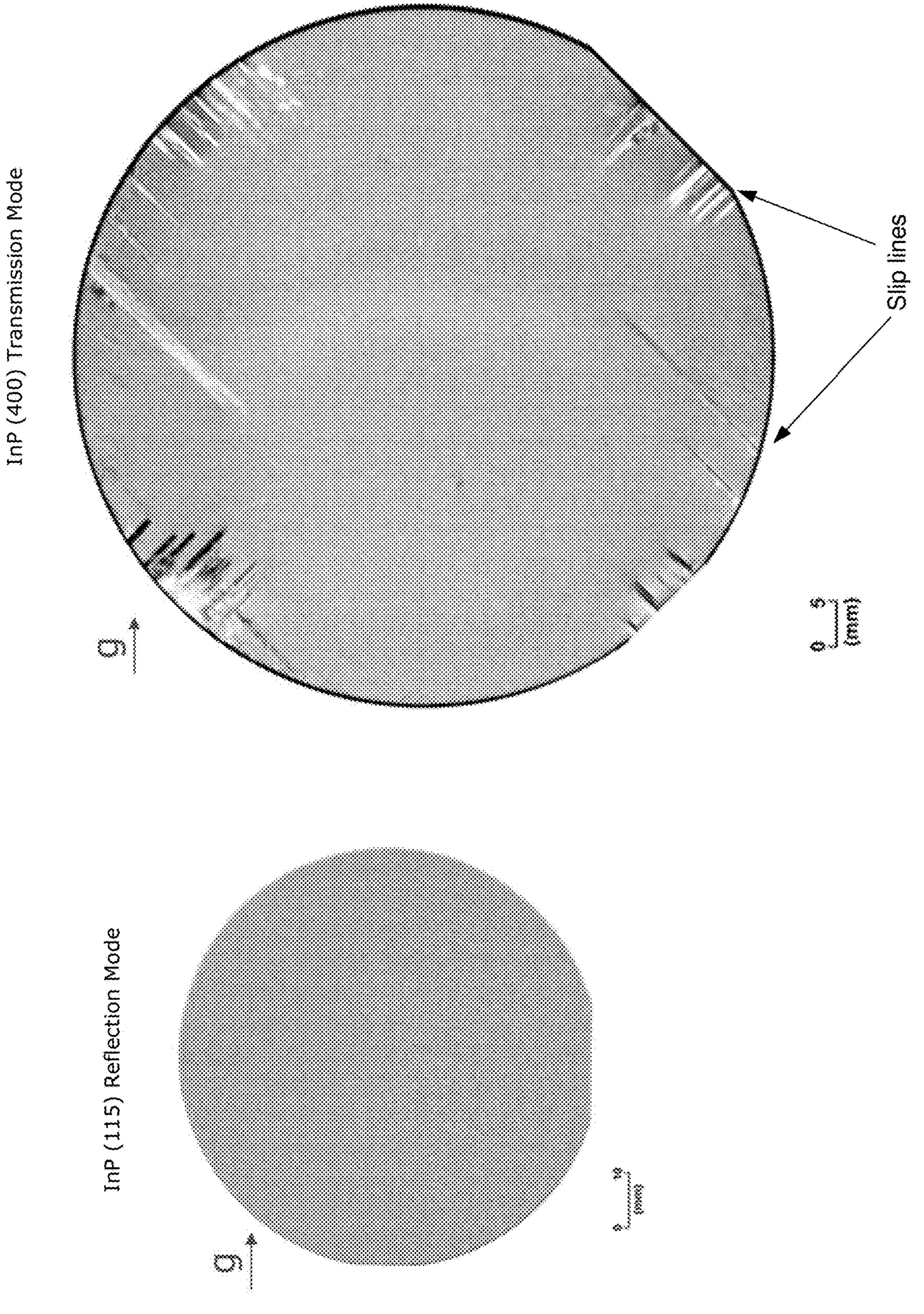

FIG. 3D shows XRDI reflection mode and transmission mode images of an InP substrate grown by yet another technique. In this case, while the reflection mode images shows no defects, the transmission mode image shows a significant amount of slip lines. These defects can lead to wafer breakage during handling or other processing, particularly when they are subjected to thermal cycling, such as during epitaxial growth. Therefore, it is important to screen single crystal semiconductor substrates for such dislocations/defects. XRDI analysis is useful in measuring substrates for slip lines and strain, where wafer specifications may include a count of the number of defects with a linear nature, such as a certain number of pixels in a row to indicate a slip line, or an area of pixels to indicate high strain regions, for example.

The InP substrates of FIGS. 3A and 3B, fabricated using the VGF process disclosed herein, has much higher structural quality than that of the wafers grown by other techniques, as shown in FIGS. 3C and 3D. The configured liquid/melt interface results in lower residual strain in the crystal lattice of the wafer, resulting in no slip lines or dislocations, as shown in the XRDI results. The other techniques, such as LEC, VCZ, and VB, result in significant strain fields, as shown in FIG. 3C, which can lead to significant wafer breakage during subsequent wafer/device processing. The area of the higher strain of FIG. 3C may be used as a specification for pass/fail of the wafer, where the wafer of FIGS. 3A and 3B have 0% of, or no, high strain while the wafer of FIG. 3C has 10-30% of high strain and some strain over all of the wafer. Similarly, the numerous defects of FIG. 3D can cause wafer breakage during wafer/device processing, and these slip lines and other defects at or near the slip lines can cause device failure during operation even if the wafers do survive wafer/device processing. A number of such slip lines may be used as a specification, where zero or none are present on the wafers of FIGS. 3A and 3B and tens of slip lines are present around the circumference of FIG. 3D.

Figure 4A:
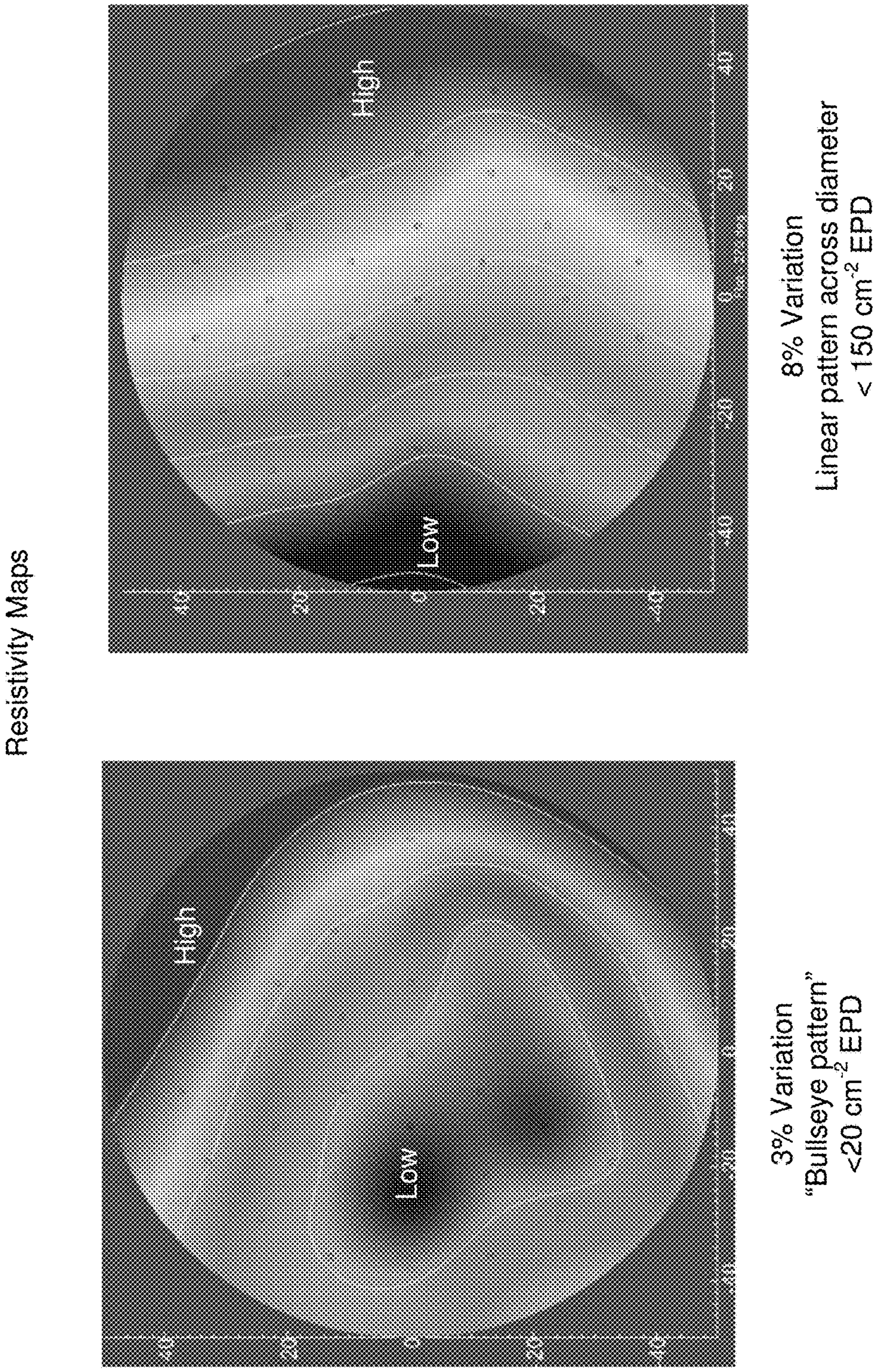
FIG. 4A illustrates resistivity maps for four inch InP substrates, in accordance with an example embodiment of the disclosure.

FIG. 4A illustrates resistivity maps for four inch InP substrates, in accordance with an example embodiment of the disclosure. Referring to FIG. 4A, there is shown resistivity maps for two InP wafers with different types of non-uniformity. Resistivity variation is a measure of the doping uniformity of the wafer and may exhibit different patterns depending on the growth technique, the melt-crystal interface, convection in the melt, and/or the location of the wafer cut from the boule. In the left plot, the resistivity variation has a "bullseye" pattern, albeit slightly skewed from center, while the right plot has a linear variation across the wafer. These variations may be affected by the melt/crystal interface shape, melt convection, and dopant diffusion, for example.

The wafer in the left plot with the "bullseye" resistivity variation has an EPD of 14 $cm^{-2}$ with ~3% resistivity variation at the head end and 17 $cm^{-2}$ with ~8% resistivity variation at the tail end, and wafers from another boule that have the more linear variation have an EPD of 100 $cm^{-2}$ at the head and 150 $cm^{-2}$ at the tail with 2.3-2.5% resistivity variation. Furthermore, another boule with a linear resistivity variation across the diameter of the wafer has an EPD of 400 $cm^{-2}$ at the head end and 450 $cm^{-2}$ at the tail end with resistivity variation of less than 3%. Therefore, some wafers demonstrate a correlation between doping variation and EPD, while others may not.

While it has been conventionally believed that a flat melt-crystal interface results in the best material, the VGF method disclosed herein shows that non-planar interfaces may result in reduced dislocation material, although doping non-uniformity may be increased as compared to crystals grown with a flat interface. Dislocations and strain may have a larger impact on wafer processing yields and device performance, so a tradeoff with doping uniformity may be acceptable, with the melt-crystal interface being an important parameter.

Figure 4B:
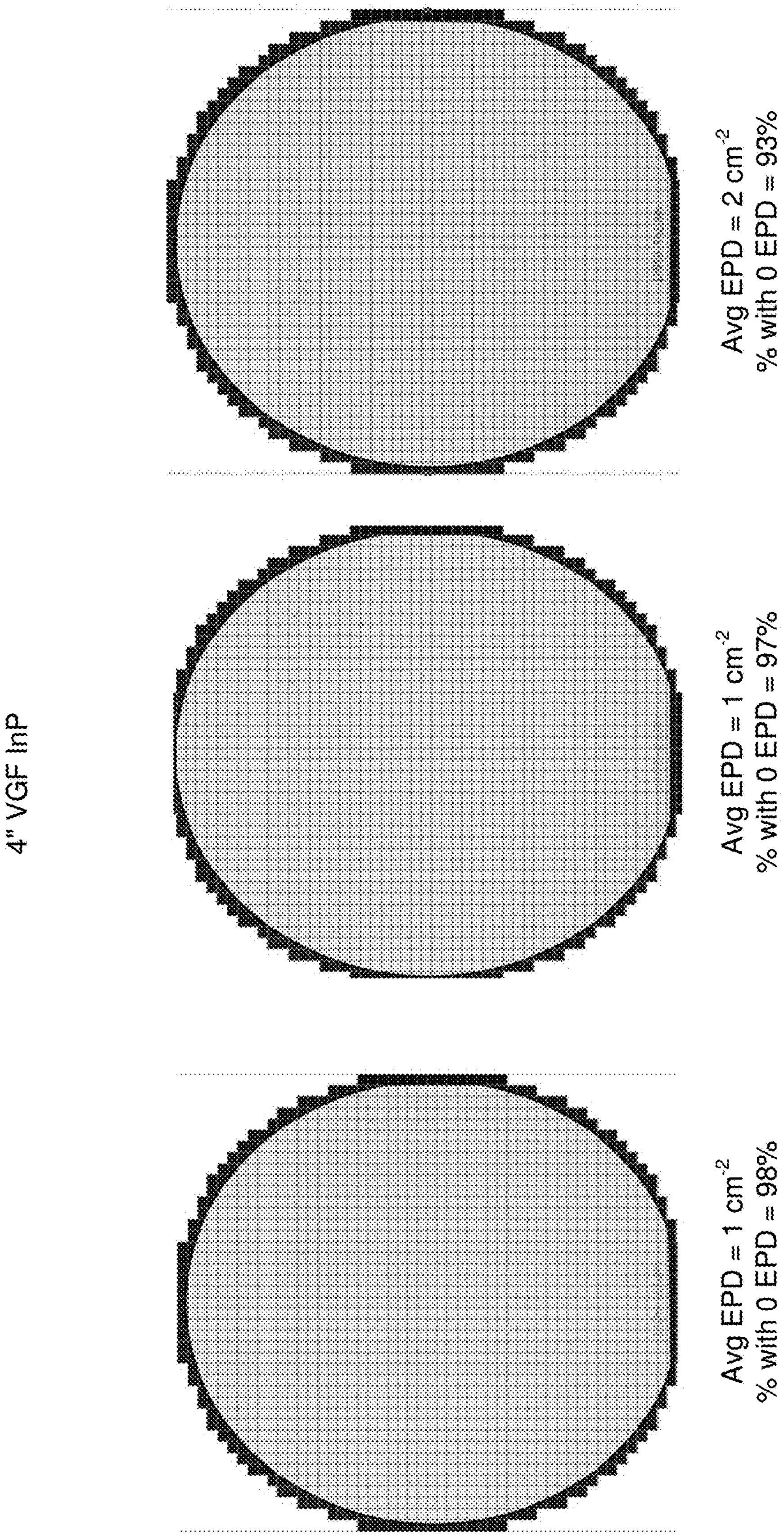
FIG. 4B illustrates etch pit density measurements of four inch VGF InP substrates, in accordance with an example embodiment of the disclosure.

FIG. 4B illustrates etch pit density measurements of three VGF InP substrates, in accordance with an example embodiment of the disclosure. Referring to FIG. 4B, there is shown EPD measurements on three four inch InP substrates grown by VGF, showing near zero defects, with an average EPD of 1-2 $cm^{-2}$ and the area of zero EPD ranging from 93 to 98%. EPDs of less than 1 $cm^{-2}$, averaging from 0.3 $cm^{-2}$ to 3 $cm^{-2}$, demonstrate the high quality InP possible with the VGF process described here. Wafers with EPD of less than 150 $cm^{-2}$, less than 50 $cm^{-2}$, less than 20 $cm^{-2}$, less than 10 $cm^{-2}$, less than 5 $cm^{-2}$, and less than 2 $cm^{-2}$ result from the VGF process. In addition areas of at least 50%, at least 60%, at least 70%, at least 80%, and at least 90% of the wafer with zero EPD are typical.

Figure 4C:
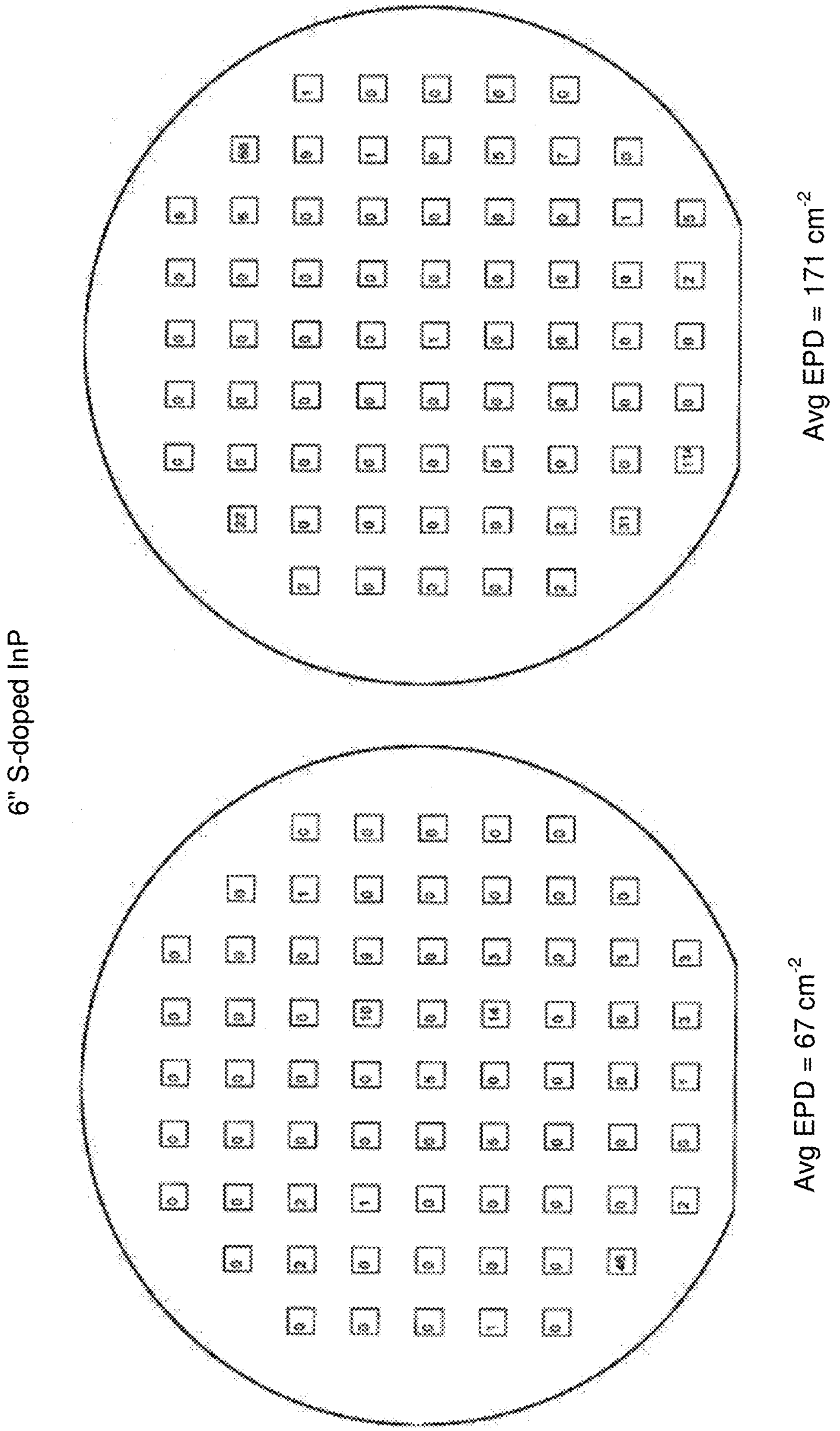
FIG. 4C illustrates etch pit density measurements of six inch VGF sulfur-doped InP substrates, in accordance with an example embodiment of the disclosure.

FIG. 4C illustrates etch pit density measurements of six inch VGF sulfur-doped InP substrates, in accordance with an example embodiment of the disclosure. Referring to FIG. 4B, there is shown two 69-point EPD results for sulfur doped InP with one wafer showing an EPD of 67 $cm^{-2}$ and the other with 171 $cm^{-2}$. The plots show very low EPD at most points in the scan other than a couple points near the corners.

Figure 4D:
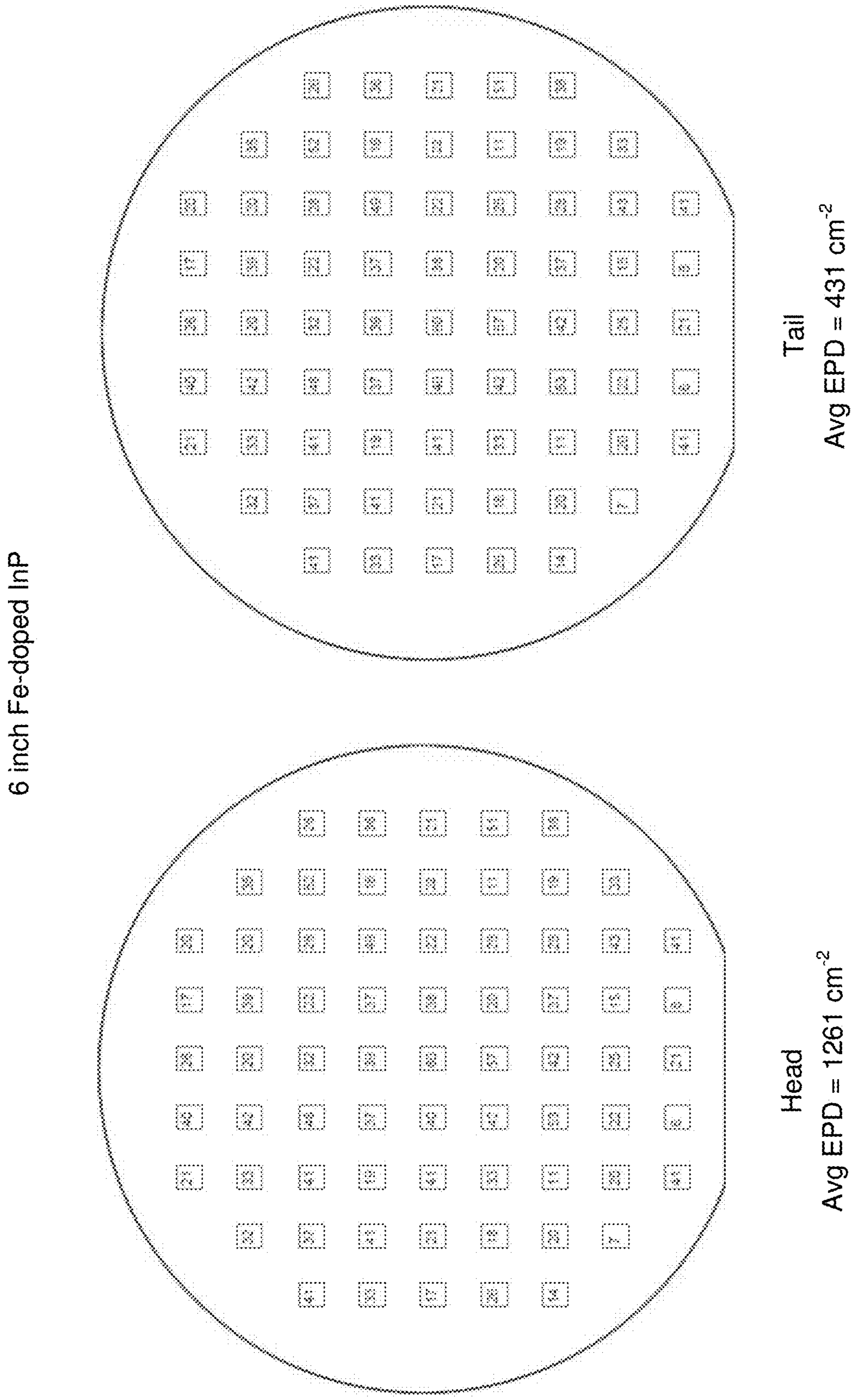
FIG. 4D illustrates etch pit density measurements of six inch VGF iron-doped InP substrates, in accordance with an example embodiment of the disclosure.

FIG. 4D illustrates etch pit density measurements of six inch VGF iron-doped InP substrates, in accordance with an example embodiment of the disclosure. Referring to FIG. 4B, there is shown two 69-point EPD results for iron-doped InP with one wafer at the head end of the boule showing an EPD of 1261 $cm^{-2}$ and the other at the tail end with 431 $cm^{-2}$. This illustrates that the VGP process described here results in EPD of 500 $cm^{-2}$ or less, 200, $cm^{-2}$ or less, 100 $cm^{-2}$ or less, 10 $cm^{-2}$ or less, and even 2 $cm^{-2}$ or less, depending on the type of dopant, in four inch and 6 inch wafers.

Figure 5A:
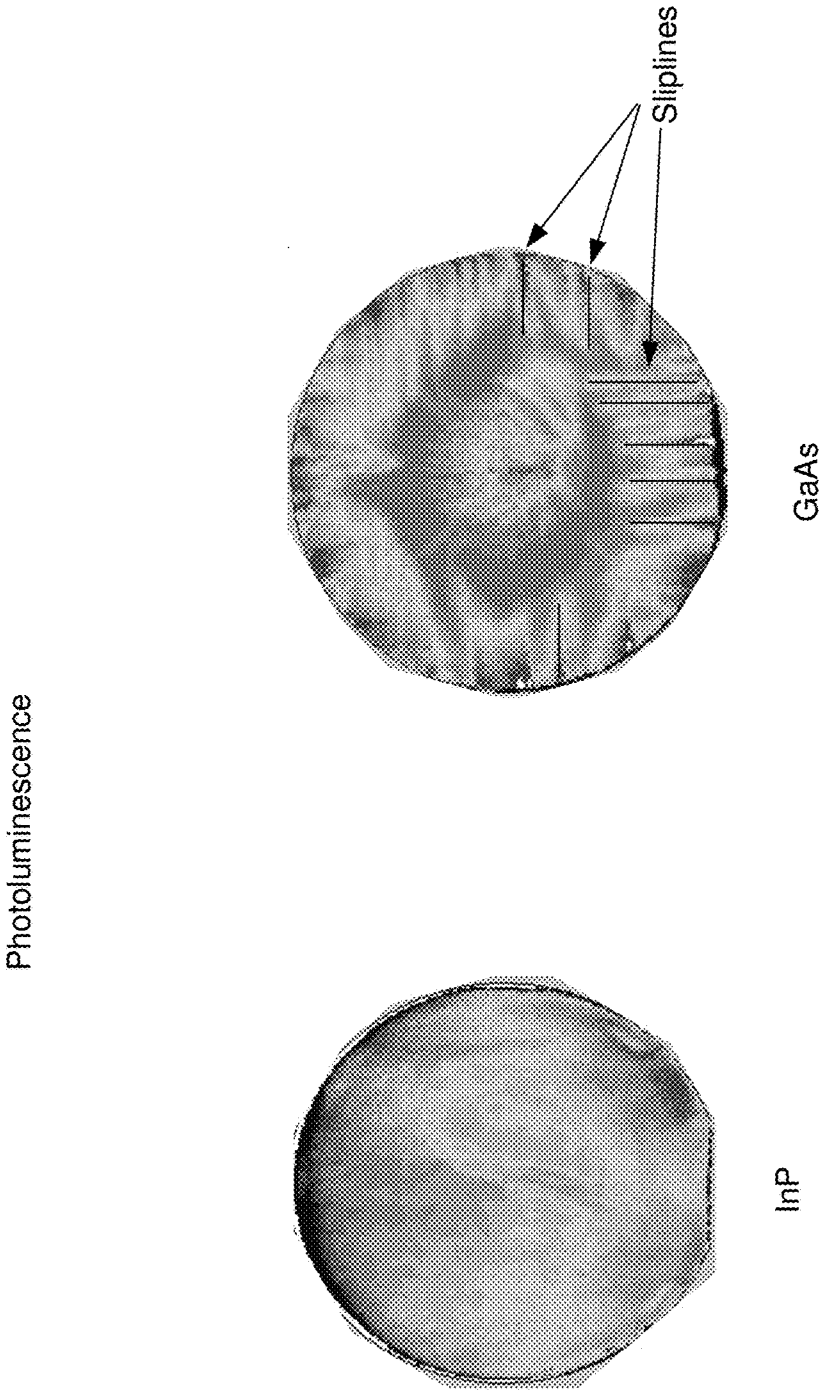
FIG. 5A illustrates photoluminescence measurements of substrates for defect sensing, in accordance with an example embodiment of the disclosure.

FIG. 5A illustrates photoluminescence measurements of substrates for defect sensing, in accordance with an example embodiment of the disclosure. Referring to FIG. 5A, there is shown photoluminescence (PL) intensity maps for an InP substrate and a GaAs substrate. PL measurements comprise the illumination of the substrate with a light source, such as a laser with a wavelength long enough that it is absorbed by the semiconductor, which generates electron-hole pairs that then recombine and generate photons that are measured by the PL setup. A PL mapping like that shown in FIG. 5A may be obtained by rotating the substrate and moving the light source radially from center to edge or vice-versa.

While the actual value of the light intensity measured from the substrate may not be useful for determining whether there are slip lines, dislocations, or other defects, the relative intensity can show defects through certain features and sharp transitions, for example. As shown in FIG. 5A, while the InP substrate does show some intensity variation across the wafer, it does not show evidence of slip lines in the intensity map indicated by narrow regions of large differences in intensity. However, the lack of slip line features is not necessarily conclusive, as slip lines may not light up in PL measurements, depending on the wavelength of the source with respect to the defect state.

The GaAs substrate has definite slip lines extending in from the edge around most of the circumference of the wafer, as indicated by the added black lines. In these regions, the PL intensity is significantly increased over nearby regions, as a large number of defects may be located at the slip lines, where defects may have a high optical absorption and fast recombination rate.

Furthermore, InP slip lines may be at different wavelengths than those at the main InP luminescence peak, so the PL measurement system may be adjusted to detect these slip lines. When detected, a total number of slip lines of a certain threshold length and/or width may be used to assess whether a substrate passes or fails a specification. For example, a certain number of slip lines may be counted or slip lines of less than 10 mm may be counted, as well as those between 10 and 20 mm, and also those greater than 20 mm. A tradeoff between wafer yield and device yield may be made to optimize overall yields and cost efficiencies.

Figure 5B:
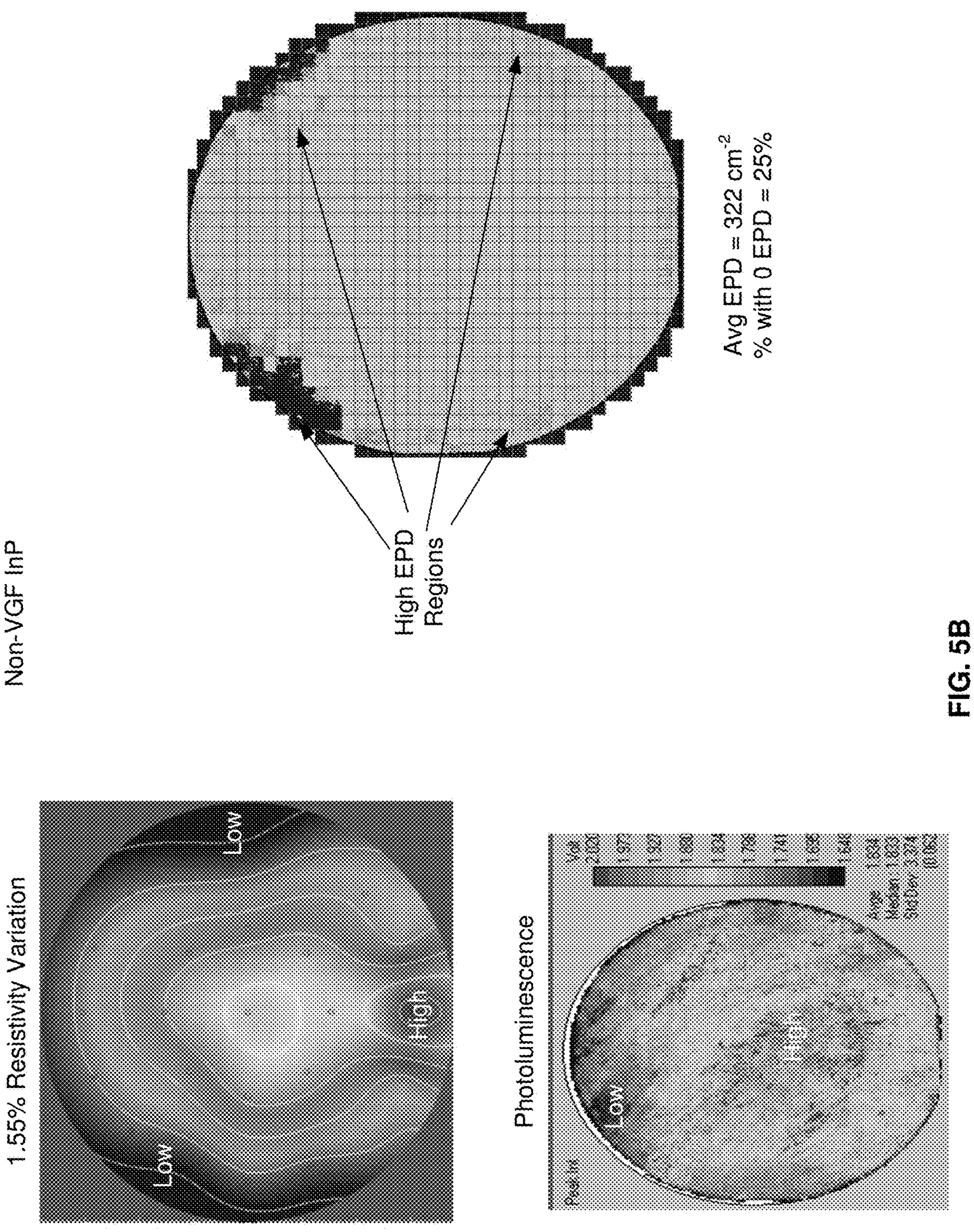
FIG. 5B illustrates resistivity, photoluminescence, and etch pit density measurements of non-VGF three inch InP substrates, in accordance with an example embodiment of the disclosure.

FIG. 5B illustrates resistivity, photoluminescence, and etch pit density measurements of non-VGF three inch InP substrates, in accordance with an example embodiment of the disclosure. Referring to FIG. 5B, there is shown a resistivity plot, a photoluminescence intensity plot, and an EPD plot for a non-VGF InP substrate. The resistivity variation is only 1.55% while the average EPD is over 300 $cm^{-2}$ and the percentage of wafer area measured without any etch pits is 25%. The high EPD regions may correlate with the presence of slip lines and other such dislocations. Patterns in the EPD plot may be utilized to determine the presence of slip lines, such as through a measurement of linear shaped high EPD regions, or 2D regions of high EPD may correlate with slip lines, so that a threshold area above an EPD level may be used to pass/fail wafers for slip lines.

Similarly, the PL intensity plot may be utilized alone or in conjunction with the resistivity and EPD plots to determine slip lines and other defects. As with high EPD regions, areas of high or low PL intensity with respect to the surrounding region may indicate the presence of defects, where linear structures and/or regions of high or low intensity may indicate slip lines.

Figure 5C:
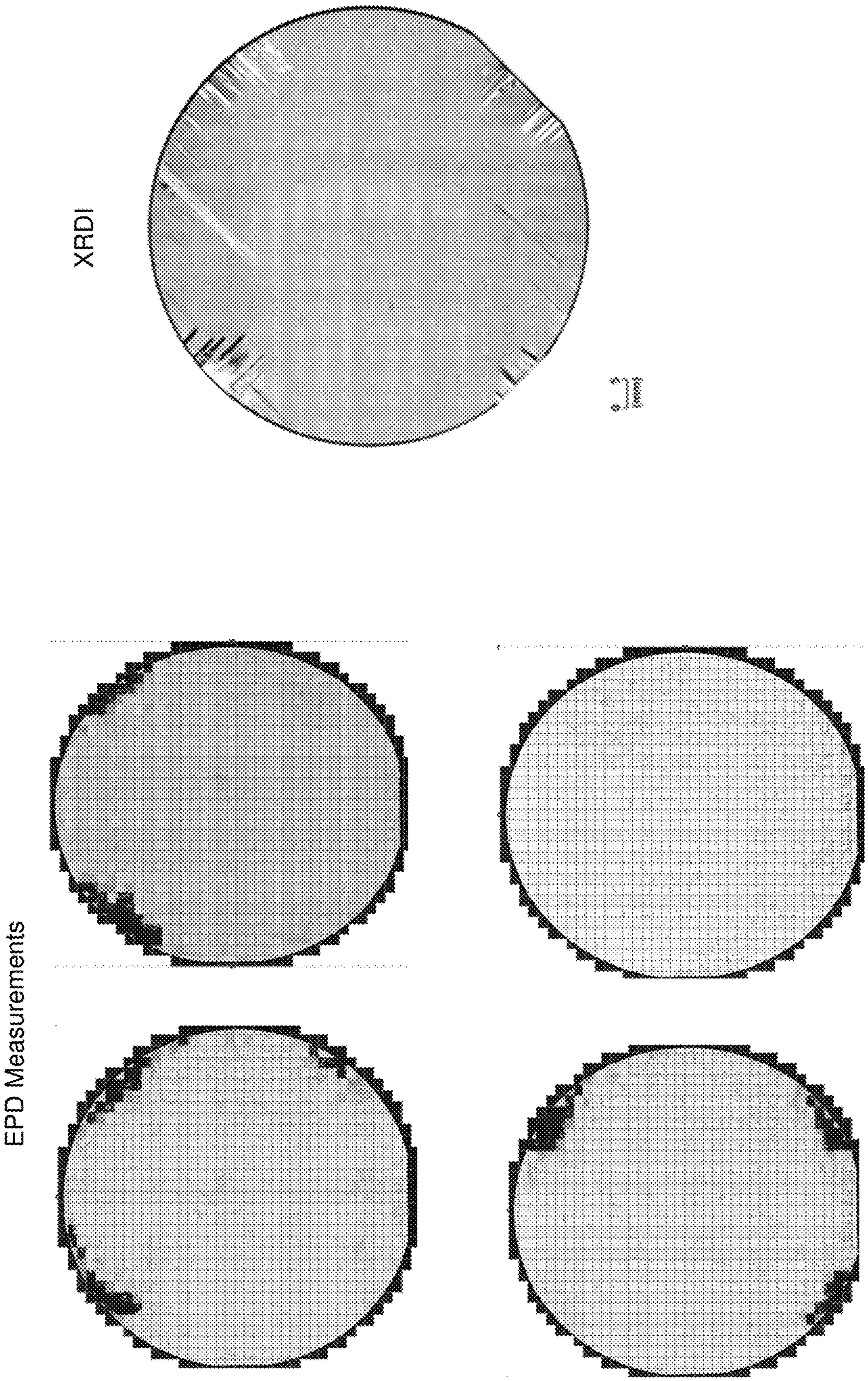
FIG. 5C illustrates a comparison of etch pit density measurements and x-ray diffraction imaging, in accordance with an example embodiment of the disclosure.

FIG. 5C illustrates a comparison of etch pit density measurements and x-ray diffraction imaging, in accordance with an example embodiment of the disclosure. Referring to FIG. 5C, there are shown EPD measurements for four non-VGF InP wafers and the XRDI measurements described previously in FIG. 3C. As can be seen in the four EPD measurements, a high density of defects is present at the edge of the wafer at the four corners of an “X” pattern, which coincides with the slip lines/dislocations shown in the XRDI image, indicating the correlation between EPD and slip lines. Therefore, each measurement technique may be utilized to determine wafer quality with respect to slip lines, EPD, and strain.

Figure 6:
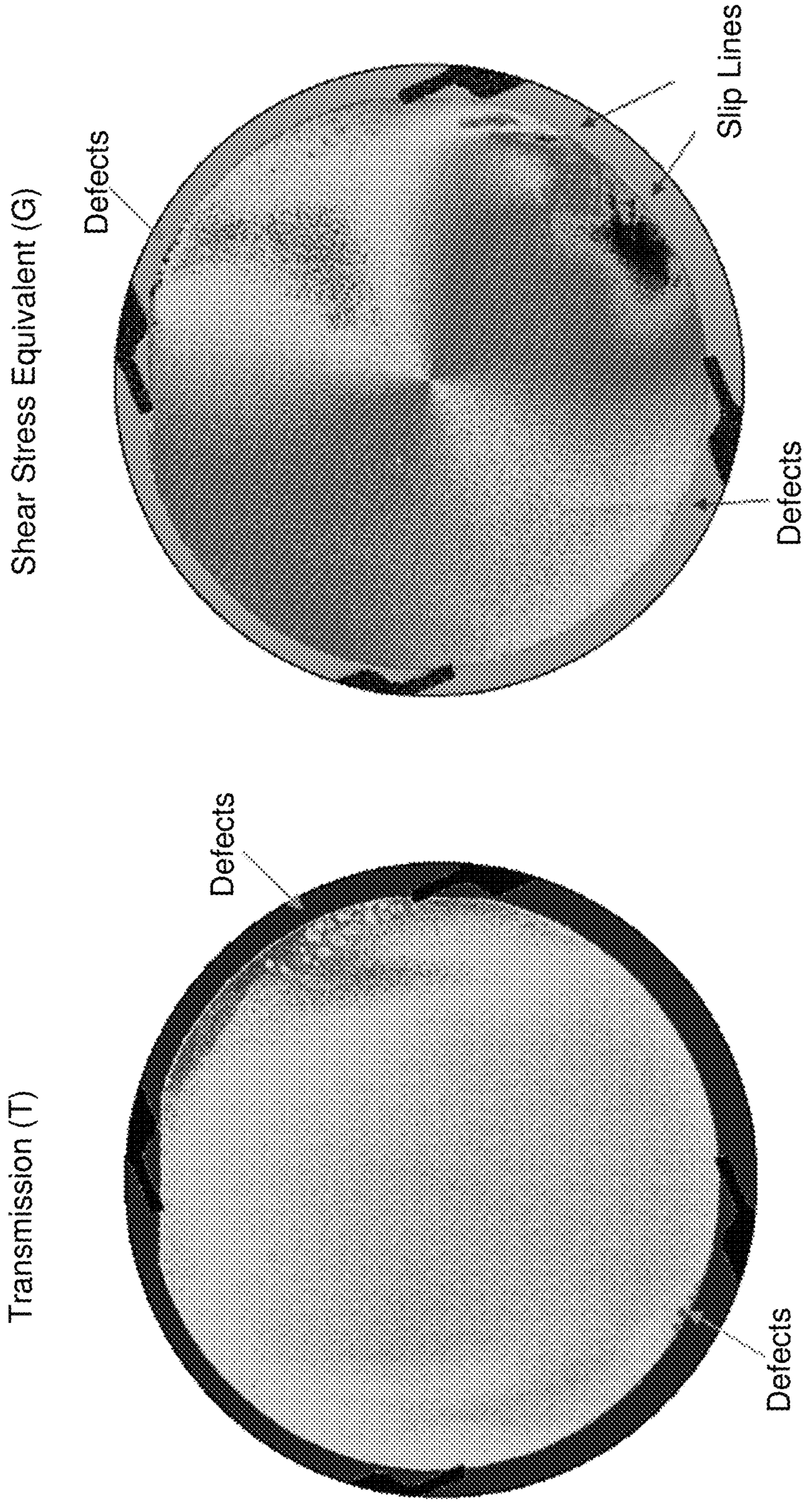
FIG. 6 illustrates photoelastic measurements of indium phosphide substrates, in accordance with an example embodiment of the disclosure.

FIG. 6 illustrates photoelastic measurements of indium phosphide substrates, in accordance with an example embodiment of the disclosure. Referring to FIG. 6, there is shown single-polarization transmission and shear stress equivalent measurements of an InP wafer. Stress in semiconductor substrates can cause breakage, warping, and cracking, and also can indicate an enhanced density of dislocations. The wavelength of the light source in photoelastic measurements is in the transparency range for the material of interest. Photoelastic measurements are based on the induced birefringence in the wafers, which is proportional to stress in the crystal. Therefore the phase shift of light through the substrate is a function of the stress and the stress magnitude may be determined from the modulation of the signal measured by a photodetector receiving the optical signal through the substrate.

The transmission measurement shown in FIG. 6 does indicate a region of defects near the edge of the wafer, which correlates to a region of higher shear stress, as indicated by the shear stress equivalent measurement. In addition, some slip lines are evident in the shear stress equivalent measurement in the uni-axial stress field and slip line-rich area in the lower right corner, indicated by linear variations in the stress. The number of such slip lines detected in photoelastic measurements can be utilized in assessing wafers for subsequent processing, where this particular wafer has 2 or 3 slip lines evident.

Figure 7:
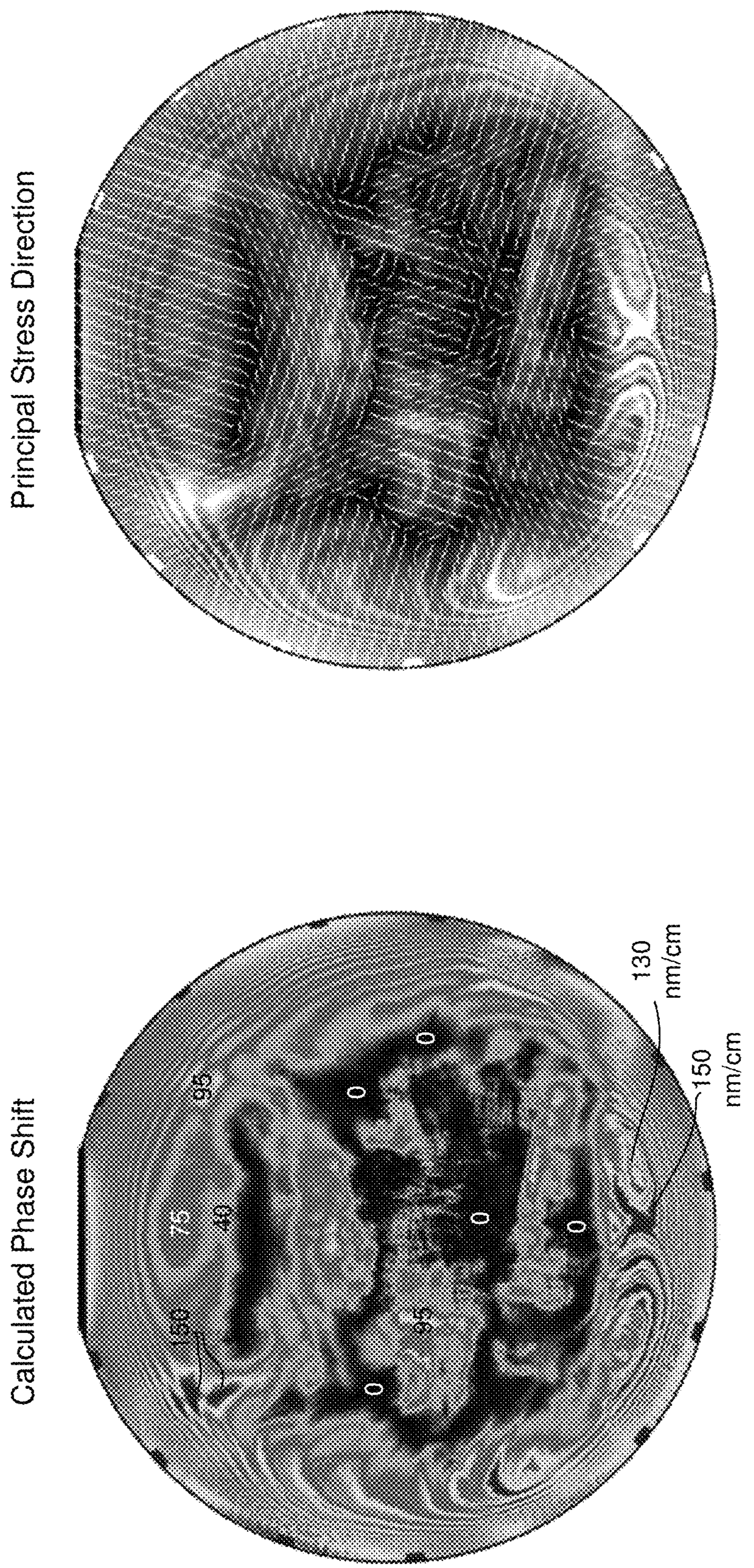
FIG. 7 illustrates phase shift and stress direction results for photoelectric measurements of substrates, in accordance with an example embodiment of the disclosure.

FIG. 7 illustrates phase shift and stress direction results for photoelectric measurements of substrates, in accordance with an example embodiment of the disclosure. Referring to FIG. 7, there is shown a multi-polarization analysis of an InP wafer with a calculated phase shift plot and principal stress direction plot. Some of the features in the phase shift plot may be interference fringes caused by thickness variation of the wafer, particularly when both substrates surfaces are polished.

The direction of stress measurement may be utilized to detect dislocations/slip lines, where a sudden flipping of stress orientation may indicate such a defect. Furthermore, the photoelastic measurement may indicate stress rings in the substrate as shown by the ringed patterns in FIG. 7, indicating an outer tensile-stressed ring. Therefore, slip lines, dislocations, and other defects may be illuminated in photoelastic measurements, with strain intensity, strain orientation flipping, or amount of areas under strain, for example, being used to assess wafer quality.

Figure 8:
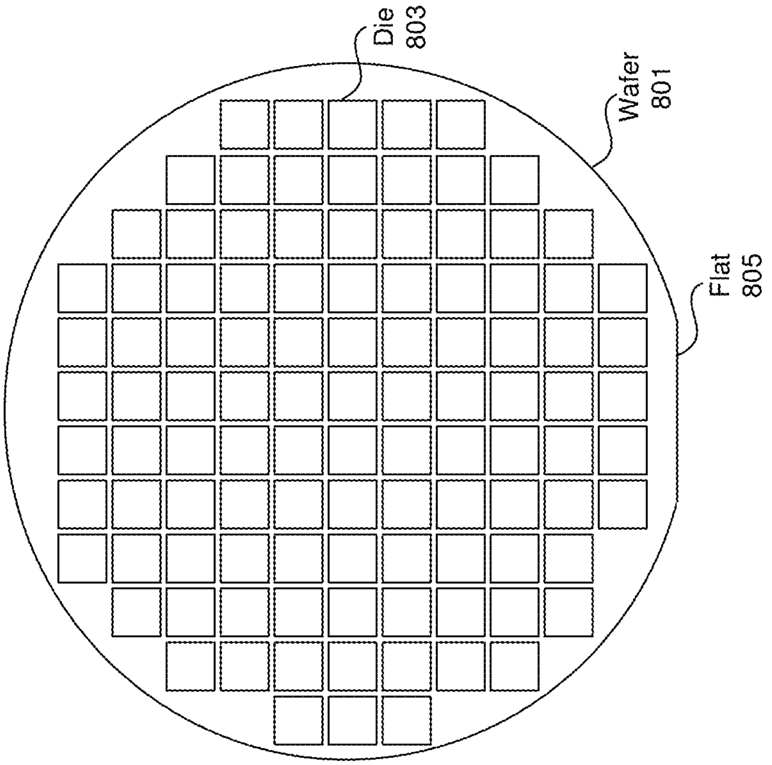
FIG. 8 illustrates devices fabricated on low etch pit density indium phosphide wafers, in accordance with an example embodiment of the disclosure.

FIG. 8 illustrates devices fabricated on low etch pit density indium phosphide wafers, in accordance with an example embodiment of the disclosure. Referring to FIG. 8, there is shown a 4 inch InP wafer 801 manufactured using the process described above, and further processed with electrical and/or optoelectronic devices on the die 803. There is also shown a flat 805, which may be formed in wafer fabrication to indicate a crystal plane, for example. The number of die 803 on the wafer 801 may be defined by the area of each die and the size shown in FIG. 8 is merely an example.

Wafer processing is a very expensive process and it is very important to have substrates without slip lines, dislocations, or strain can greatly improve process yields. Providing InP substrates without these defects enables wafer processing to proceed without, or limited, wafer breakage due to substrate quality.

In an embodiment of the disclosure, low etch pit density, low slip line density, and low strain indium phosphide wafers may include an indium phosphide single crystal wafer having a diameter of 4 inches or greater, having a measured etch pit density of less than 500 $cm^{-2}$, and having fewer than 5 dislocations or slip lines as measured by x-ray diffraction imaging. The wafer may have a measured etch pit density of 200 $cm^{-2}$ or less, or 100 $cm^{-2}$ or less, or 10 $cm^{-2}$ or less. The wafer may have a diameter of 6 inches or greater. An area of the wafer with a measured etch pit density of zero may at least 80% of the total area of the surface. An area of the wafer with a measured etch pit density of zero may be at least 90% of the total area of the surface. A resistivity plot of the wafer may have a bullseye pattern with regions of increasing resistivity from center to outer edge of the wafer. Electronic and/or optoelectronic devices may be formed on a first surface of the wafer. The wafer may have a thickness of 300 μm or greater.

In another embodiment of the disclosure, a process for low etch pit density, low slip line density, and low strain indium phosphide wafers may include sealing charge material comprising polycrystalline indium phosphide seed crystal, $B_2O_3$ encapsulant, and a dopant in a crucible; sealing the crucible in a quartz ampoule; performing a vertical gradient freeze crystal growth process by heating the ampoule using a multi-zone heating system to progressively melt the charge material until a portion of the seed crystal is melted; starting growth from the partially melted seed by implementing a controlled cooling of the multi-zone heating system; applying a temperature gradient of between 1 and 8 C/cm at a melt-crystal interface; controlling a shape of the interface to be concave to the melt utilizing cooling rates in the multi-zone heating system to form a solidified indium phosphide crystal; and slicing the crystal to create indium phosphide wafers of four inches in diameter or larger with an etch pit density of 500 $cm^{-2}$ or less.

The cooling of the multi-zone heating system may be controlled at the rate of 0.1 to 2 C/h. The crucible may be evacuated before sealing it into the quartz ampoule. The solidified charge material may be cooled at rates of 0.5 to 5 C/h, 1 to 10 C/h and 5 to 20 C/h for different heating zones for the first 300 C, and then at rates of 20-50 C/h to room temperature. The interface shape may be controlled to be concave to the melt, with the center being ~10 mm lower than the edge of the solidified crystal. The wafers may have a diameter of 6 inches or more. The wafers may have an etch pit density of 200 $cm^{-2}$ or less, 100 $cm^{-2}$ or less, or 10 $cm^{-2}$ or less.

While the invention has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method, comprising:

sealing charge material comprising polycrystalline indium phosphide seed crystal, $B_2O_3$ encapsulant, and a dopant in a crucible;

sealing the crucible in a quartz ampoule;

performing a vertical gradient freeze crystal growth process by heating the ampoule using a multi-zone heating system to progressively melt the charge material until a portion of the seed crystal is melted;

starting growth from the portion of the melted seed crystal by implementing a controlled cooling of the multi-zone heating system;

applying a temperature gradient of between 1 and 8 C/cm at a melt-crystal interface; and controlling a shape of the interface to be concave to the melt utilizing cooling rates in the multi-zone heating system to form a solidified indium phosphide crystal of four inches in diameter or larger with an etch pit density of 500 $cm^{-2}$ or less.

2. The method according to claim 1, comprising controlling the cooling of the multi-zone heating system at the rate of 0.1 to 2 C/h.

3. The method according to claim 1, comprising evacuating the crucible before sealing it into the quartz ampoule.

4. The method according to claim 1, comprising cooling the charge material at rates of 0.5 to 5 C/h, 1 to 10 C/h and 5 to 20 C/h for different heating zones for a first 300 C, and then at rates of 20-50 C/h to room temperature.

5. The method according to claim 1, comprising controlling the interface shape to be concave to the melt, with the center being ~10 mm lower than an edge of the solidified indium phosphide crystal.

6. The method according to claim 1, wherein the solidified indium phosphide crystal has a diameter of 6 inches or more.

7. The method according to claim 1, wherein the solidified indium phosphide crystal has an etch pit density of 200 $cm^{-2}$ or less.

8. The method according to claim 1, wherein the solidified indium phosphide crystal has an etch pit density of 100 $cm^{-2}$ or less.

9. The method according to claim 1, wherein the solidified indium phosphide crystal has an etch pit density of 10 $cm^{-2}$ or less.

10. A method, comprising:

sealing charge material comprising a seed crystal, an encapsulant, and a dopant in a crucible;

sealing the crucible in an ampoule;

performing a vertical gradient freeze crystal growth process by heating the ampoule using a multi-zone heating system to progressively melt the charge material until a portion of the seed crystal is melted;

starting growth from the portion of the melted seed crystal by implementing a controlled cooling of the multi-zone heating system;

applying a temperature gradient of between 1 and 8 C/cm at an interface between the melted charge material to formed crystal; and controlling a shape of the interface to be concave to the melted charge material utilizing cooling rates in the multi-zone heating system to form a solidified crystal of four inches in diameter or larger with an etch pit density of 500 $cm^{-2}$ or less.

11. The method according to claim 10, comprising controlling the cooling of the multi-zone heating system at the rate of 0.1 to 2 C/h.

12. The method according to claim 10, comprising evacuating the crucible before sealing it into the ampoule.

13. The method according to claim 10, comprising cooling the charge material at rates of 0.5 to 5 C/h, 1 to 10 C/h and 5 to 20 C/h for different heating zones for a first 300 C, and then at rates of 20-50 C/h to room temperature.

14. The method according to claim 10, comprising controlling the interface shape to be concave to the melt, with the center being ~10 mm lower than an edge of the solidified crystal.

15. The method according to claim 10, comprising slicing the solidified crystal to create wafers.

16. The method according to claim 15, wherein the wafers have a diameter of 6 inches or more.

17. The method according to claim 15, wherein the wafers have an etch pit density of 200 $cm^{-2}$ or less.

18. The method according to claim 15, wherein the wafers have an etch pit density of 100 $cm^{-2}$ or less.

19. The method according to claim 15, wherein the wafers have an etch pit density of 10 $cm^{-2}$ or less.

* * * * *